(12) United States Patent
Hung et al.

(10) Patent No.: US 12,719,266 B2
(45) Date of Patent: Aug. 25, 2026

(54) ELECTROSTATIC DISCHARGE (ESD) PROTECTION CIRCUIT USING TIE-CELL TECHNIQUE

(71) Applicant: TAIWAN SEMICONDUCTOR MANUFACTURING COMPANY LTD., Hsinchu (TW)

(72) Inventors: Tao-Yi Hung, Hsinchu (TW); Jam-Wem Lee, Hsinchu (TW); Wun-Jie Lin, Hsinchu City (TW); Kuo-Ji Chen, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 113 days.

(21) Appl. No.: 18/823,739

(22) Filed: Sep. 4, 2024

(65) Prior Publication Data

US 2026/0066646 A1 Mar. 5, 2026

(51) Int. Cl.
*H02H 9/04* (2006.01)
*H03K 17/687* (2006.01)

(52) U.S. Cl.
CPC ........... *H02H 9/045* (2013.01); *H03K 17/687* (2013.01)

(58) Field of Classification Search
CPC ....... H02H 9/045; H02H 9/046; H03K 17/687
USPC .... 361/156, 111, 91.1, 118, 58, 119, 57, 86, 361/212; 29/825; 257/362
See application file for complete search history.

(56) References Cited

U.S. PATENT DOCUMENTS 10,003,336 B1 * 6/2018 Wang ................. H03K 19/1776
2012/0182663 A1 * 7/2012 Bennett .................. H02H 9/046 361/111
2016/0241020 A1 * 8/2016 Tseng ....................... H02H 9/04
2017/0288398 A1 * 10/2017 Worley .......... H03K 19/018528

* cited by examiner

*Primary Examiner* — Elim Ortiz
(74) *Attorney, Agent, or Firm* — WPAT LAW; Anthony King

(57) ABSTRACT

The present disclosure provides an integrated circuit, which includes internal circuitry; a pre-driver, a switch device, a post-driver, and an I/O pad. The internal circuitry is configured to generate an input/output (I/O) signal. The pre-driver is configured to generate a first voltage signal based on the I/O signal. The switch device is coupled to the pre-driver. The post-driver is configured to convert the first voltage signal to a second voltage signal. The I/O pad is coupled to the post-driver, and configured to receive the second voltage signal. The switch device is activatable to electrically connect the internal circuitry to the post-driver when the integrated circuit is in a normal operation mode. The switch device is deactivatable to isolate the pre-driver from the post-driver when the integrated circuit is in an electrostatic discharge (ESD) mode and an ESD event occurs on the I/O pad.

20 Claims, 4 Drawing Sheets

ELECTROSTATIC DISCHARGE (ESD) PROTECTION CIRCUIT USING TIE-CELL TECHNIQUE

BACKGROUND

The current trend towards miniaturization of integrated circuits (ICs) has led to the development of smaller, more energy-efficient devices that offer increased functionality at higher speeds. However, this miniaturization process has also made these devices more susceptible to electrostatic discharge (ESD) events, due to factors such as thinner dielectric thicknesses and reduced dielectric breakdown voltages. ESD is a significant cause of electronic circuit damage and is a key consideration in advanced semiconductor technology.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1:
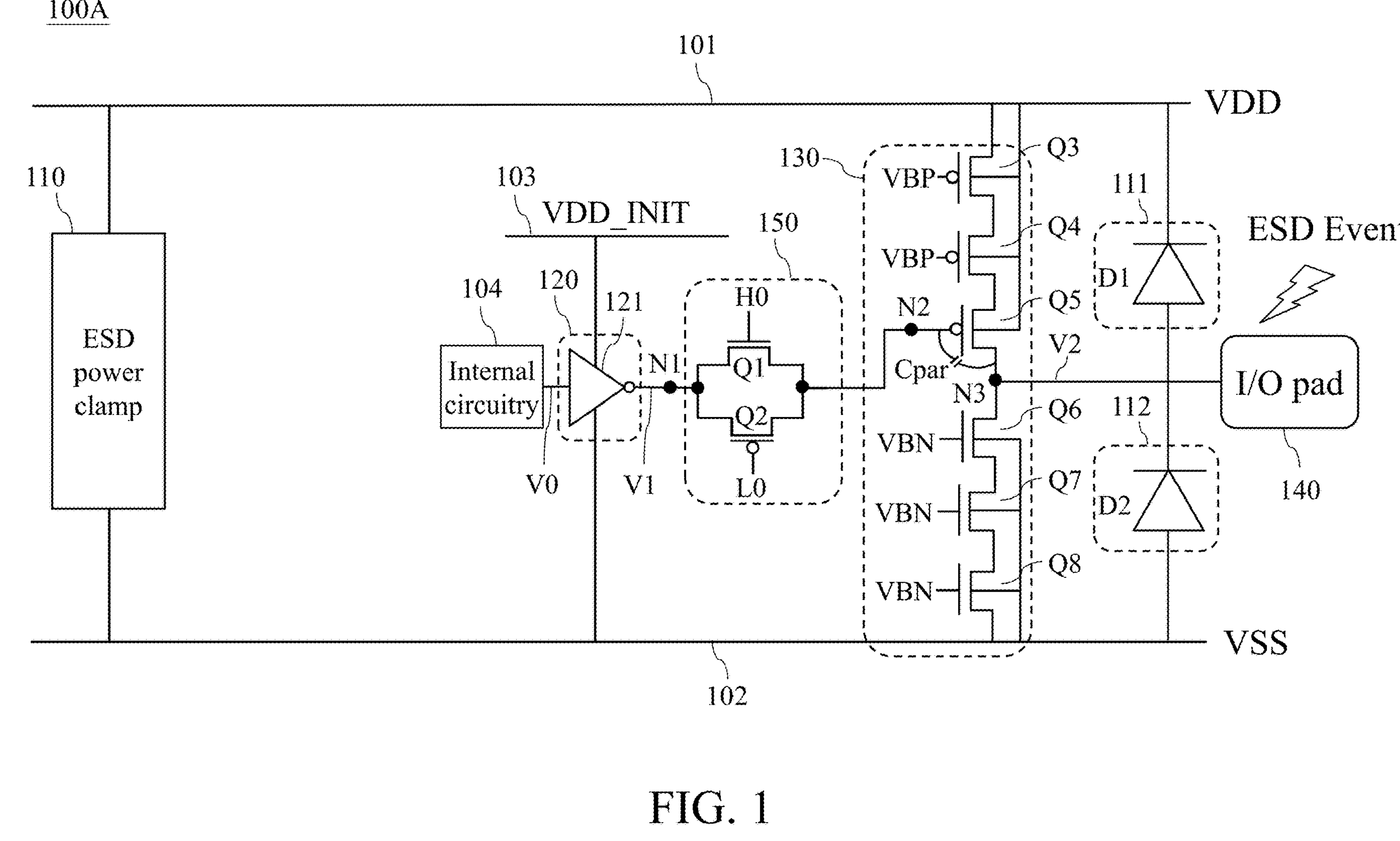
FIG. 1 is a schematic diagram of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In some embodiments, an integrated circuit includes internal circuitry, a pre-driver, a transmission gate, a post-driver, an I/O pad, and a detection circuit. The pre-driver converts an input/output signal generated by the internal circuitry to a first voltage signal within a first voltage domain. The transmission gate is coupled between the pre-driver and the post-driver. The post-driver is configured to convert the first voltage signal to a second voltage signal within a second voltage domain. The I/O pad receives the second voltage signal generated by the post-driver. The transmission gate is activatable by a first control signal and a second control signal generated by the detection circuit to electrically connect the pre-driver and the post-driver when the integrated circuit is in a normal operation mode. The transmission gate is deactivatable to isolate the pre-driver from the post-driver when the integrated circuit is in an ESD mode and an ESD event occurs on the I/O pad.

FIG. 1 is a schematic diagram of an integrated circuit in accordance with some embodiments of the present disclosure.

In some embodiments, the integrated circuit 100A may be a CMOS (complementary metal oxide semiconductor) integrated circuit (IC) which includes internal circuitry 104, an ESD power clamp 110, a pre-driver 120, a post-driver 130, a transmission gate 150, and ESD protection devices 111 and 112, as depicted in FIG. 1. The ESD power clamp 110 is configured to protect the internal circuitry 104 from ESD events. The ESD power clamp 110 may be disposed between a voltage supply node 101 of a power supply voltage VDD and a reference voltage supply node 102 of a reference voltage VSS.

Internal circuitry 104 is coupled to the I/O pad 140 through the pre-driver 120, transmission gate 150, and the post-driver 130. In some embodiments, internal circuitry 104 is coupled to voltage supply node 103 of a power supply voltage VDD_INIT and the reference voltage supply node 102 of the reference voltage VSS. In some embodiments, internal circuitry 104 is configured to receive the supply voltage VDD_INIT from the voltage supply node 103, and the reference voltage VSS from the reference voltage supply node 102 (e.g., VSS).

Internal circuitry 104 includes circuitry configured to generate or process the input/output (I/O) signal received by or output to I/O pad 140. In some embodiments, internal circuitry 104 comprises core circuitry configured to operate using the power supply voltage VDD_INIT at the voltage supply node 103, which is lower than the power supply voltage VDD at the voltage supply node 101. In some embodiments, internal circuitry 104 includes at least one n-type or p-type transistor device. In some embodiments, internal circuitry 104 includes at least a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, internal circuitry 104 includes at least a memory cell. In some embodiments, the memory cell includes a static random access memory (SRAM), a dynamic RAM (DRAM), a resistive RAM (RRAM), a magnetoresistive RAM (MRAM) or read only memory (ROM). In some embodiments, internal circuitry 104 includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like), FinFETs, and planar MOS transistors with raised source/drain. Examples of passive elements include, but are not limited to, capacitors, inductors, fuses, and resistors. In some embodiments, the pre-driver 120 can be integrated into the internal circuitry 104.

The voltage supply node 101 is coupled to the ESD protection device 111 and the ESD power clamp 110. The reference voltage supply node 102 is coupled to the ESD protection device 112 and the ESD power clamp 110. The voltage supply node 101 is configured to receive the power supply voltage VDD for normal operation of the transmission gate 150, post-driver 130, and the ESD protection device 111 and 112. Similarly, the reference voltage supply node 102 is configured to receive the reference voltage VSS for normal operation of the transmission gate 150, post-driver 130, and the ESD protection device 111 and 112.

In some embodiments, the voltage supply node 101 is a voltage supply pad, while the reference voltage supply node 102 is a reference voltage supply pad. Additionally, the voltage supply node 103 is also a voltage supply pad. In some embodiments, a pad is at least a conductive surface, a pin, a node, or a bus. The voltage supply node 101 can be referred to as a power supply rail of the power supply voltage VDD, the reference voltage supply node 102 can be referred to as a power supply rail of the reference voltage VSS, and the voltage supply node 103 can be referred to a power rail of the power supply voltage VDD_INIT. In the example configurations in FIG. 1 to 3, the power supply voltage VDD is a positive power supply voltage, the voltage supply node 101 is a positive power supply voltage terminal, the reference voltage VSS is a ground voltage, and the reference voltage supply node 102 is a ground voltage terminal. Additionally, the power supply voltage VDD_INIT is a positive power supply voltage, and the voltage supply node 103 is a positive power supply voltage terminal. It should be noted that other power supply arrangements are within the scope of the present disclosure.

In some embodiments, the I/O pad 140 is coupled to the internal circuitry 104 through the post-driver 130, the transmission gate 150, and the pre-driver 120. The I/O pad 140 is configured to receive an I/O signal (e.g., V0) from the internal circuitry 104 or configured to output an I/O signal to the internal circuitry 104. The I/O pad 140 is at least a pin that is coupled to the internal circuitry 104. In some embodiments, the I/O pad 140 is a node, a bus, or a conductive surface that is coupled to the internal circuitry 104.

In some embodiments, the ESD protection device 111 is coupled between the voltage supply node 101 and the I/O pad 140. The ESD protection device 111 can be implemented using diode D1. For example, an anode of diode D1 is coupled to the I/O pad 140, the post-driver 130, and a cathode of diode D2. A cathode of diode D1 is coupled to the voltage supply node 101 and the ESD power clamp 110. In some embodiments, diode D1 is a voltage pull-up device or referred to as a p+ diode. For example, the p+ diode is formed between a p-well region (not shown) and an n-well region (not shown), and the n-well region is connected to the power supply voltage VDD.

In some embodiments, the ESD protection device 112 is coupled between the I/O pad 140 and the reference voltage supply node 102. The ESD protection device 112 can be implemented using diode D2. For example, an anode of diode D2 is coupled to the reference voltage supply node 102 and the ESD power clamp 110. A cathode of diode D2 is coupled to the I/O pad 140, the post-driver 130, and the anode of diode D1. In some embodiments, diode D2 is a voltage pull-down device or referred to as an n+ diode. For example, the n+ diode is formed between an n+ junction (not shown) and a p-substrate (not shown), and the p-substrate is connected to the reference voltage VSS or the ground.

In some embodiments, the ESD protection devices 111 and 112 (e.g., diodes D1 and D2) are configured to have minimal impact on the normal operations (e.g., no ESD event occurs) of the internal circuitry 104 or the integrated circuit 100A. In some embodiments, when no ESD event occurs, the ESD protection devices 111 and 112 do not affect the normal operation of the internal circuitry 104 or the integrated circuit 100A. In some embodiments, an ESD event occurs when an ESD voltage or current higher than a level of voltage or current expected during the normal operation of the internal circuitry 104 is applied to at least the voltage supply node 101, reference voltage supply node 102, or I/O pad 140. During an ESD event, the ESD protection device 111 is configured to transfer voltage or current between the voltage supply node 101 and the I/O pad 140 depending on whether the ESD protection device 111 is forward biased or reverse biased, and the voltage levels of the voltage supply node 101 and the I/O pad 140.

In some embodiments, during a positive-to-VDD (PD) mode of an ESD event or stress, the ESD protection device 111 is forward biased and is configured to transfer voltage from the I/O pad 140 to the voltage supply node 101. In the PD mode, a positive EDS voltage or stress (e.g., higher than the power supply voltage VDD) is applied to the I/O pad 140, while the voltage supply node 101 is a ground terminal and the reference voltage supply node 102 is floating.

In some embodiments, during a negative-to-VDD (ND) mode of an ESD event or stress test, the ESD protection device 111 is reverse biased and is configured to transfer voltage from the voltage supply node 101 to the I/O pad 140. In the ND mode, a negative ESD voltage or stress is received by the I/O pad 140, while the voltage supply node 101 is a ground terminal and the reference voltage supply node 102 is floating.

Similarly, the ESD protection device 112 is configured to transfer voltage or current between the reference voltage supply node 102 and the I/O pad 140 depending on whether the ESD protection device 112 is forward biased or reversed biased, and the voltage levels of the reference voltage supply node 102 and the I/O pad 140.

In some embodiments, during a positive-to-VSS (PS) mode of an ESD event or stress, the ESD protection device 112 is reversed biased and is configured to transfer voltage or current from I/O pad 140 to the reference voltage supply node 102. In the PS mode, a positive ESD voltage or stress (e.g., higher than the reference voltage VSS) is applied to the I/O pad 140, while the voltage supply node 101 is floating and the reference voltage supply node 102 is a ground terminal.

In some embodiments, during a negative-to-VSS (NS) mode of an ESD event or stress, the ESD protection device 112 is forward biased and is configured to transfer voltage or current from the reference voltage supply node 102 to the I/O pad 140. In the NS mode, a negative ESD voltage or stress is received by the I/O pad 140, while the voltage supply node 101 is floating and the reference voltage supply node 102 is a ground terminal. It should be noted that other types of diodes, configurations and arrangements of the ESD protection devices 111 and 112 are within the scope of the present disclosure.

In some embodiments, the ESD power clamp 110 is a transient clamp. For example, in some embodiments, the ESD power clamp 110 is configured to handle transient or rapid ESD events, e.g., rapid changes in voltage and/or current from the ESD event. During the transient or rapid ESD event, the ESD power clamp 110 is configured to turn on very quickly to provide a shunt path between voltage supply node 101 (e.g., power supply voltage VDD) and reference voltage supply node 102 (e.g., VSS) before the ESD event can cause damage to one or more elements within integrated circuit 100A.

In some embodiments, the ESD power clamp 110 is a static clamp. In some embodiments, static clamps are configured to provide a static or steady-state voltage and current response. For example, static clamps are turned-on by a fixed voltage level.

In some embodiments, the ESD power clamp 110 includes a large NMOS transistor or PMOS transistor (e.g., a BigFET with relatively large width) configured to carry the ESD current without entering the avalanche breakdown region of the ESD power clamp 110. In some embodiments, the ESD power clamp 110 is implemented without having avalanching junctions inside the ESD power clamp 110. It should be noted that other types of clamp circuits, configurations and arrangements of the ESD power clamp 110 are within the scope of the present disclosure.

In some embodiments, the pre-driver 120 is coupled between the power supply voltage VDD_INIT and the reference voltage supply node 102. The pre-driver 120 may be implemented using an inverter 121 (or a buffer) to improve the driving capability of the I/O signal V1 generated by the internal circuitry 104.

In some embodiments, the transmission gate 150 is coupled between the output terminal (e.g., node N1) of the pre-driver 120 and the gate terminal (e.g., node N2) of transistor Q5 of the post-driver 130. The transmission gate 150 includes transistors Q1 and Q2 that are controlled by control signals H0 and L0, respectively. The control signals H0 and L0 may be generated by a detection circuit 160 (e.g., shown in FIG. 2) depending on the operation mode, such as a normal operation mode or an ESD mode, of the integrated circuit 100, allowing the transmission gate 150 to act as a switch that is configured to electrically connect the pre-driver 120 to the post-driver 130 when the integrated circuit 100A is in the normal operation mode, and disconnect the pre-driver 120 from the post-driver 130 when the integrated circuit 100A is in the ESD mode.

In some embodiments, when the integrated circuit 100 is in the normal operation mode, the voltage signal V1 generated by the pre-driver 120 is transmitted to the gate terminal of transistor Q5 of the post-driver 130 through the transmission gate, where the voltage signal V1 generated by the pre-driver 120 is within a first voltage domain between the power supply voltage VDD_INIT and the reference voltage VSS. The post-driver 130 is configured to convert the voltage signal V1 generated by the pre-driver 120 within the first voltage domain to generate an output signal V2 (e.g., at node N3) within a second voltage domain between the power supply voltage VDD and the reference voltage VSS.

The post-driver 130 includes transistor Q3 to Q8 connected in series to form a cascode structure, with the body terminals of transistors Q3 to Q5 connected to the voltage supply node 101, and body terminal of transistors Q6 to Q6 connected to the reference voltage supply node 102. Transistors Q3 to Q5, which form a voltage pull-up section, are P-type transistors connected in series between the voltage supply node 101 and the I/O pad 140, and transistors Q6 to Q8, which form a voltage pull-down section, are N-type transistors in series between the I/O pad 140 and the reference voltage supply node 102. The gate terminals of transistors Q6 to Q8 are controlled by a bias voltage VBN, while the gate terminals of transistors Q3 and Q4 are controlled by a bias voltage VBP. In some embodiments, the gate terminals of transistor Q3 to Q8 are connected to node N2, indicating that the bias voltages VBP and VBN are the same as the voltage signal V1 at node N1. In some embodiments, the bias voltage VBP can be controlled by a power management circuit (not shown), such that transistors Q3 to Q5 are turned on and turned off when the voltage signal V1 is in the low logic state (e.g., "GND") and the high logic state (e.g., "VDD_INIT"), respectively. Similarly, the bias voltage VBN can be controlled by the power management circuit (not shown), such that transistors Q6 to Q8 are turned off and turned on when the voltage signal V1 is in the low logic state (e.g., "GND") and the high logic state (e.g., "VDD_INIT"), respectively.

For example, when the integrated circuit 100 is in the normal operation mode, the voltage signal V1 generated by the pre-driver 120 is transferred to the gate terminal (e.g., node N2) of transistor Q5. When the voltage signal V1 generated by the pre-driver 120 is in the low-logic state (e.g., "0"), transistors Q3 to Q5 are turned on and transistors Q6 to Q8 are turned off, pulling up the voltage signal V2 at node N3 to the power supply voltage VDD through transistors Q3 to Q5. When the voltage signal V1 generated by the pre-driver 120 is in the high-logic state (e.g., "VDD_INIT"), transistors Q6 to Q8 are turned on and transistors Q3 to Q5 are turned off, pulling down the voltage signal V2 at node N3 to reference voltage VSS through transistors Q6 to Q8. Therefore, the voltage signal V2 at node N3 can operate within the second voltage domain between the power supply voltage VDD and the reference voltage VSS.

In some approaches, the output terminal (e.g., node N1) of the pre-driver 120 is directly connected to the gate terminal (e.g., node N2) of transistor Q5 of the post-driver, with omission of the transmission gate 150. In this situation, when the integrated circuit 100 is in the positive-to-VSS (PS) mode of an ESD event or stress, a positive ESD voltage or stress (e.g., a very high positive voltage) is applied to the I/O pad 140 which is connected to the source/drain terminal (e.g., node N3) of transistor Q5. At this time, the gate terminal of transistor Q5 is considered as being grounded, and the voltage difference between the gate terminal (e.g., node N2) and source/drain terminal (e.g., node N3) is very high which exceeds the voltage tolerance range of the gate oxide of transistor Q5, resulting in damage to transistor Q5 (e.g., a victim transistor).

In contrast, referring to FIG. 1 of the present disclosure, the transmission gate 150 is coupled between the output terminal (e.g., node N1) of the pre-driver 120 and the gate terminal (e.g., node N2) of transistor Q5 of the post-driver 130. The activation and deactivation of the transmission gate 150 may depend on the operation mode of the integrated circuit 100, such as the normal operation mode or the ESD mode. For example, when the integrated circuit 100 is in the normal operation mode, the transmission gate 150 is activated (e.g., H0=1 and L0=0), connecting the output terminal (e.g., node N1) of the pre-driver 120 and the gate terminal (e.g., node N2) of transistor Q5 of the post-driver 130. Accordingly, the resistance of the conductive wire between the output terminal (e.g., node N1) of the pre-driver 120 and the gate terminal (e.g., node N2) of transistor Q5 of the post-driver 130 is very small. When the integrated circuit 100 is in the ESD mode, the transmission gate 150 is deactivated (e.g., H0=0 and L0=1), isolating the output terminal (e.g., node N1) of the pre-driver 120 from the gate terminal (e.g., node N2) of transistor Q5 of the post-driver 130. Accordingly, the gate terminal (e.g., node N2) of transistor Q5 is floating, resulting in the gate voltage of transistor Q5 being substantially equal to the ESD voltage of the ESD event or stress occurring on the I/O pad 140 due to the voltage coupling effect through the parasitic capacitance Cpar between the gate terminal (e.g., node N2) and source/drain terminal (e.g., node N3) of transistor Q5. Therefore, the voltage stress between the gate terminal (e.g., node N2) and source/drain terminal (e.g., node N3) of transistor Q5 can be suppressed, ensuring safety of the gate oxide of transistor Q5 during the ESD mode.

Figure 2:
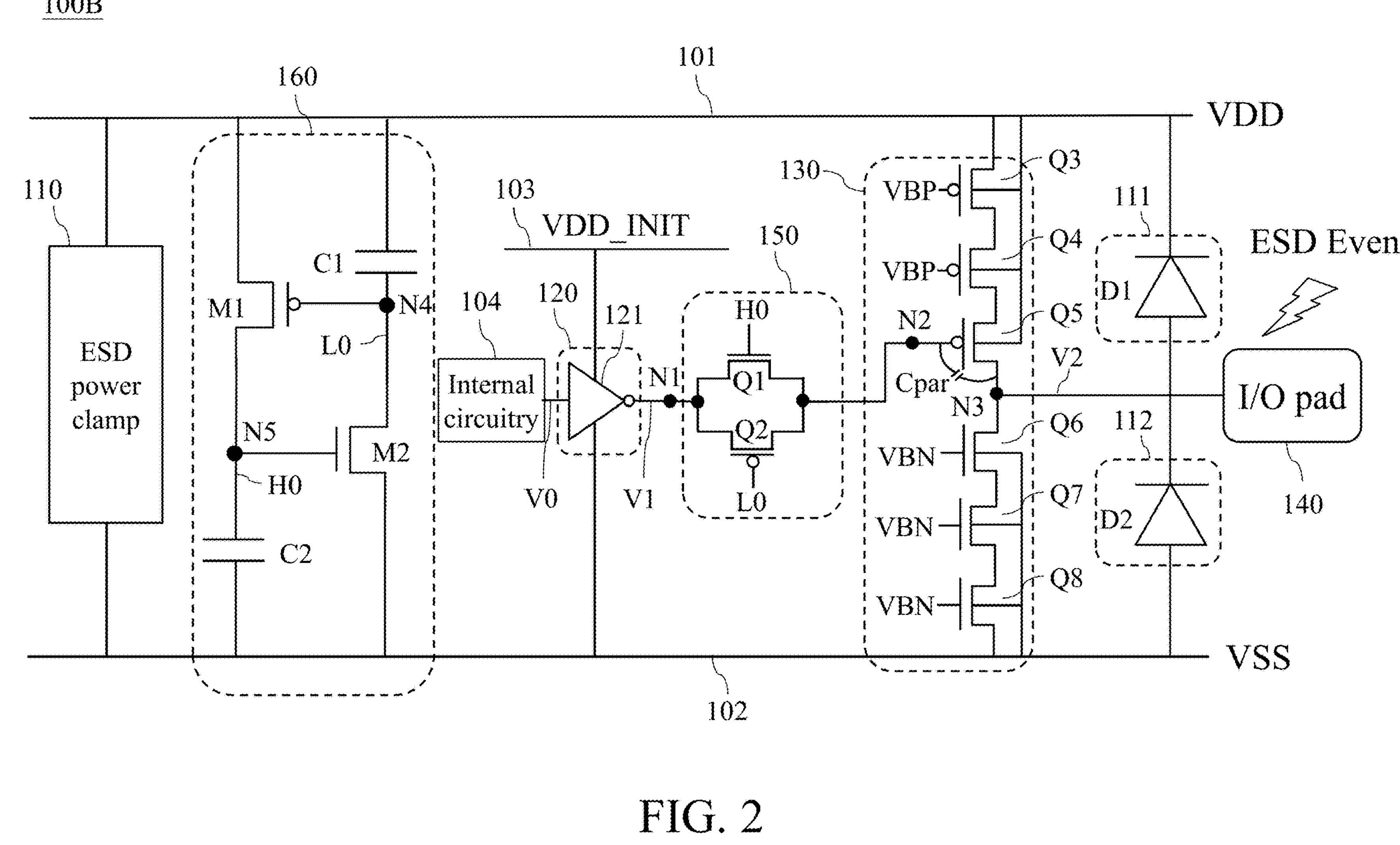
FIG. 2 is a schematic diagram of an integrated circuit in accordance with some embodiments of the present disclosure.

FIG. 2 is a schematic diagram of an integrated circuit in accordance with some embodiments of the present disclosure.

In some embodiments, the integrated circuit 100B shown in FIG. 2 may be similar to the integrated circuit 100A shown in FIG. 1, with the difference being that the integrated circuit 100B shown in FIG. 2 further includes a detection circuit 160 configured to generate control signals H0 and L0 for the transmission gate 150 when the integrated circuit 100B is in the normal operation mode or the ESD mode. In some embodiments, the detection circuit 160 is configured to detect the ESD event or stress occurring on the I/O pad 140 when the integrated circuit 100B is in the ESD mode, allowing the control signals L0 and H0 to turn off the transmission gate 150 in response to the ESD event or stress, thereby protect the gate oxide of transistor Q5 from damages caused by the ESD event or stress. Additionally, the detection circuit 160 is configured to generate the control signals L0 and H0 to turn on the transmission gate 150 when the integrated circuit 100B is in the normal operation mode.

In some embodiments, the detection circuit 160 includes transistors M1-M2 and capacitors C1-C2, as depicted in FIG. 2. Transistor M1 includes a gate terminal coupled to node N4, a first terminal coupled to the voltage supply node 101, a second terminal coupled to node N5. Transistor M2 includes a gate terminal coupled to node N5, a first terminal coupled to node N4, and a second terminal coupled to the reference voltage supply node 102. Capacitor C1 is coupled between the voltage supply node 101 and node N4, while capacitor C2 is coupled between node N5 and the reference voltage supply node 102.

In some embodiments, when the integrated circuit 100B is in the normal operation mode, the power supply voltage VDD and reference voltage VSS are supplied to the voltage supply node 101 and the reference voltage supply node 102, respectively. At this time, the control signal L0 at node N4 is pulled up to the power supply voltage VDD through capacitor C1, and the control signal H0 at node N5 is pulled down to the reference voltage VSS through capacitor C2. The voltage signal L0 at node N4 is in the high logic state, turning off transistor M1. The control signal H0 at node N5 is in the low logic state, turning off transistor M2. Since the control signals L0 and H0 are respectively in the high logic state and low logic state, transistors Q1 and Q2 within the transmission gate 150 are turned on, reducing the resistance of the conductive wire from the output terminal (e.g., node N1) of the pre-driver 120 to the gate terminal (e.g., node N2) of transistor Q5 of the post-driver 130. Accordingly, the voltage signal V1 at the output terminal (e.g., node N1) of the pre-driver 120 can be transferred to the gate terminal (e.g., node N2) of transistor Q5 of the post-driver 130.

In some embodiments, when the integrated circuit 100B is in the ESD mode, the power supply voltage VDD and reference voltage VSS are not supplied to the voltage supply node 101 and the reference voltage supply node 102, respectively. When an ESD event or stress with an ESD voltage (e.g., a high positive voltage) occurs at the I/O pad 140, the voltage at the voltage supply node 101 will be substantially equal to the ESD voltage of the ESD event or stress minus the threshold voltage of diode D1. Because the voltage at the voltage supply node 101 is higher than the voltage (e.g., L0) at node N4, transistor M1 is turned on, pulling up the voltage (e.g., H0) at node N5. Accordingly, transistor M2 is turned on, pulling down the voltage (e.g., L0) at node N4 to the ground (e.g., reference voltage supply node 102). As a result, transistor M1 is fully turned on since the voltage difference between the voltages at node N4 and the voltage supply node 101 becomes greater. Therefore, the voltage at node N4 (i.e., control signal L0) is tied to a high voltage (e.g., logic "1"), and the voltage at node N5 (i.e., control signal H0) is tied to the ground voltage (e.g., logic "0"). When the control signals L0 and H0 are respectively in the high logic state and the low logic state, transistors Q1 and Q2 within the transmission gate 150 are turned off, isolating the output terminal (e.g., node N1) of the pre-driver 120 from the gate terminal (e.g., node N2) of the post-driver 130. Accordingly, when an ESD event or stress occurs at the I/O pad 140, the gate voltage of transistor Q5 is substantially equal to the ESD voltage of the ESD event or stress due to the voltage coupling effect through the parasitic capacitance Cpar between the gate terminal (e.g., node N2) and source/drain terminal (e.g., node N3) of transistor Q5. Therefore, the voltage stress between the gate terminal (e.g., node N2) and source/drain terminal (e.g., node N3) of transistor Q5 can be suppressed, ensuring safety of the gate oxide of transistor Q5 during the ESD mode.

Figure 3:
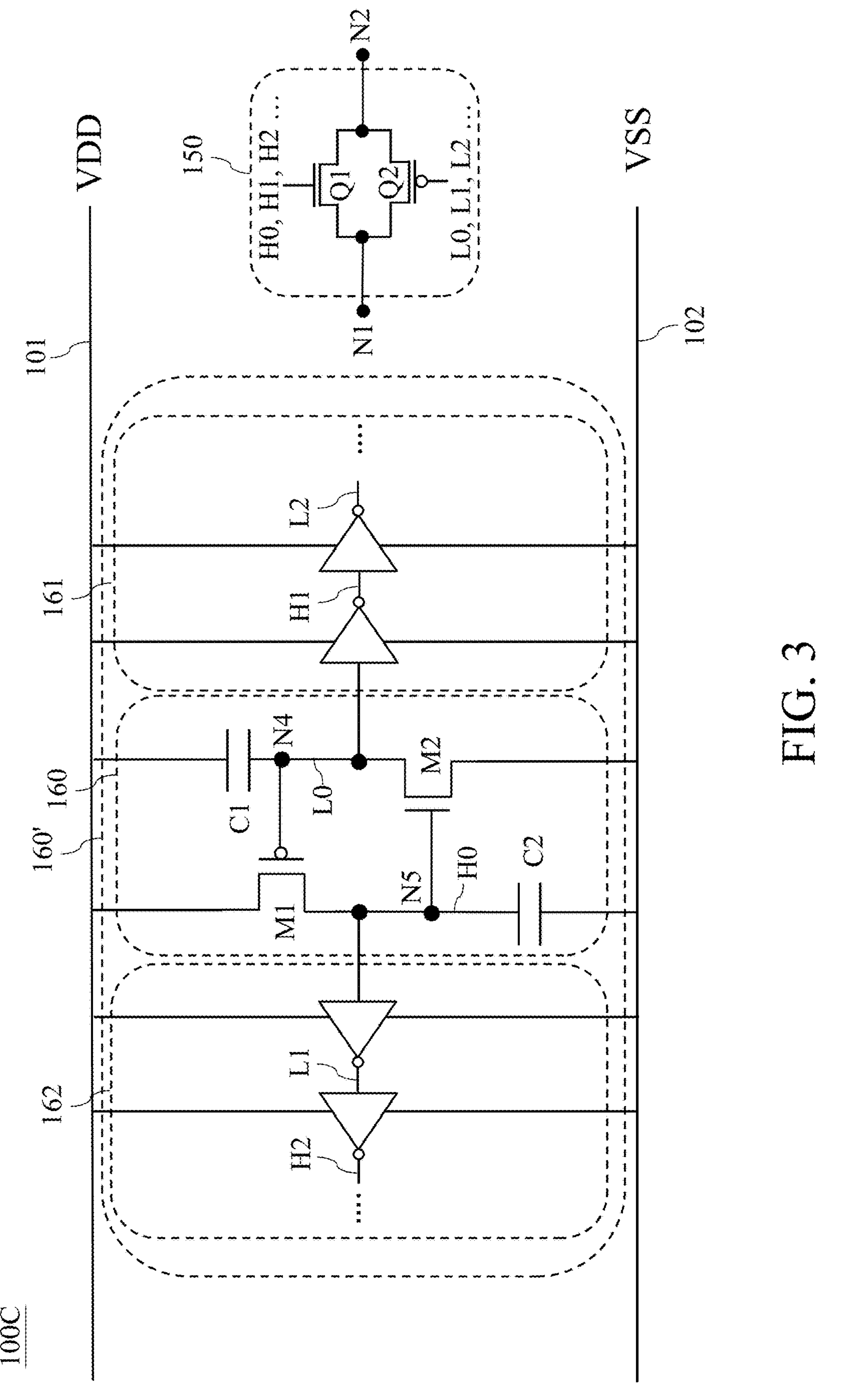
FIG. 3 is a partial schematic diagram of the integrated circuit 100C in accordance with some embodiments of the present disclosure.

FIG. 3 is a partial schematic diagram of the integrated circuit 100C in accordance with some embodiments of the present disclosure.

In some embodiments, the integrated circuit 100C shown in FIG. 3 is similar to the integrated circuit 100B shown in FIG. 2, with the difference being that the integrated circuit 100C includes a detection circuit 160' instead of the detection circuit 160 shown in FIG. 2. For purposes of description, the detection circuit 160' and the transmission gate 150 are shown in FIG. 3.

In some embodiments, the detection circuit 160' shown in FIG. 3 is an extension of the detection circuit 160 shown in FIG. 2. For example, the detection circuit 160' includes the detection circuit 160 with inverter chains 161 and 162 coupled to nodes N4 and N5, respectively. The inverter chain 161 is configured to generate a series of inverted signals based on the control signal L0, such as H1, L2, H3, L4, and so on. The inverter chain 162 is configured to generate a series of inverted signals based on the control signal H0, such as L1, H2, L3, H4, and so on. The inverter chains 161 and 162 may have the same number of inverters connected in series. The number of inverters within the inverter chains 161 and 162 may depend on the driving requirement of the integrated circuit 100C. For example, if there is a need for a larger capacitance loading of the transmission gate 150, more inverters can be added to the inverter chains 161 and 162. If there is a need for a smaller capacitance loading of the transmission gate 150, less inverters can be added to the inverter chains 161 and 162 or the inverter chains 161 and 162 can be omitted.

In some embodiments, each of the inverter chains 161 and 162 may have a predetermined number of inverters connected in series, and the control signals applied to transistors Q1 and Q2 can be determined based on the required capacitance loading for the transmission gate 150. If a large capacitance loading for the transmission gate 150 is used, the control signals H2 and L2 can be applied to the gate terminals of transistors Q1 and Q2 within the transmission gate 150, respectively. If a small capacitance loading for the transmission gate 150 is used, the control signals H0 and L0 (or H1 and L1) can be applied to the gate terminals of transistors Q1 and Q2 within the transmission gate 150, respectively.

Figure 4:
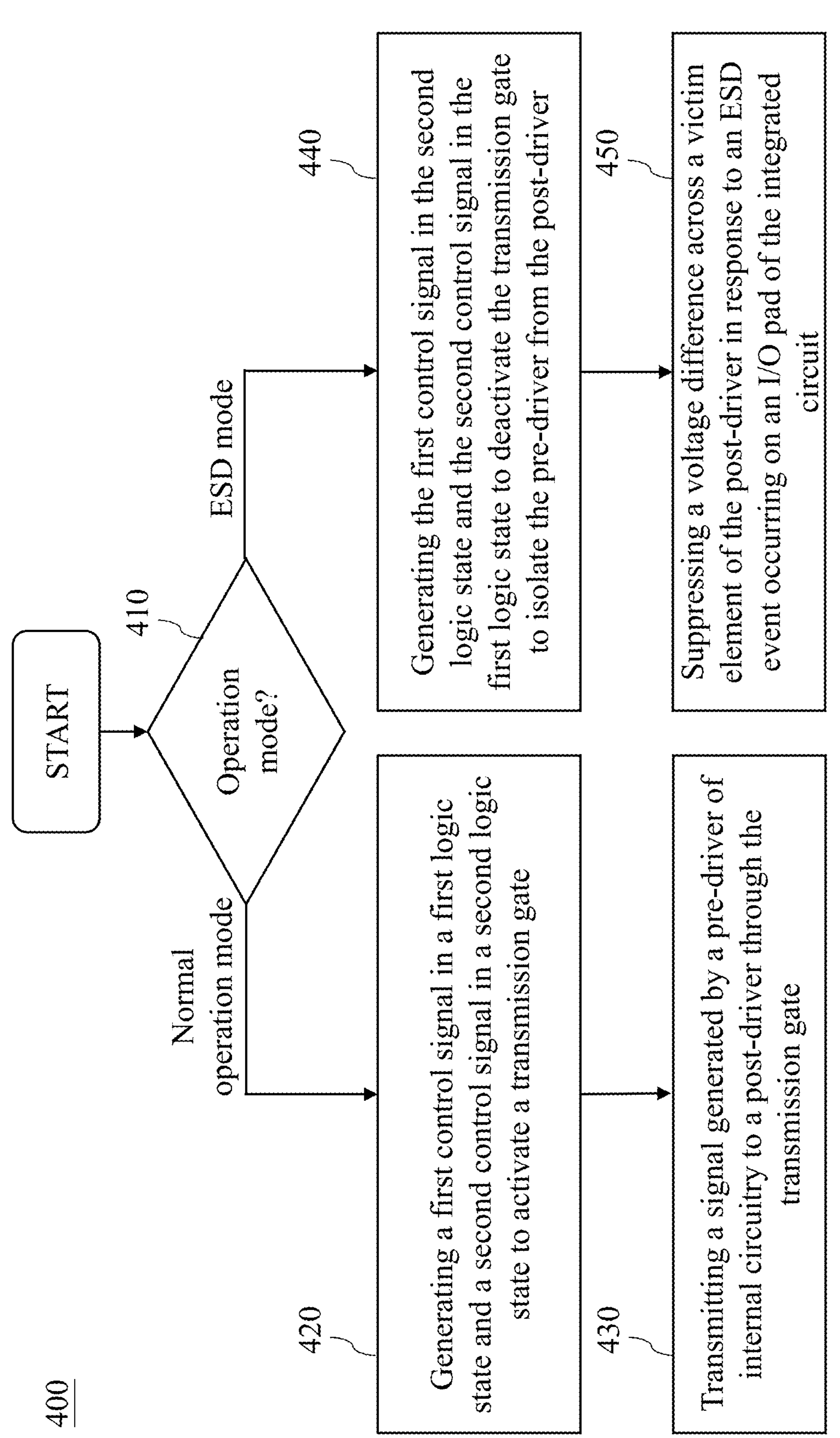
FIG. 4 is a flowchart of a method for operating an integrated circuit in accordance with some embodiments of the present disclosure.

FIG. 4 is a flowchart of a method for operating an integrated circuit in accordance with some embodiments of the present disclosure. Please refer to both FIG. 2 and FIG. 4.

The flow 400 of the method shown in FIG. 4 includes operations 410 to 450. In operation 410, an operation mode of the integrated circuit 100 is determined. In some embodiments, when the operation mode of the integrated circuit 100 is a normal operation mode, flow 400 proceeds to operation 420. When the operation mode of the integrated circuit 100 is an ESD mode, flow 400 proceeds to operation 430.

In operation 420, a first control signal in a first logic state and a second control signal in a second logic state are generated to activate a transmission gate. In some embodiments, the first control signal and the second control signal may refer to the control signals H0 and L0 shown in FIG. 2, respectively. The first logic state and the second logic state may refer to the high logic state (e.g., "1") and the low logic state (e.g., "0"), respectively. When the first control signal is in the high logic state and the second control signal is in the low logic state, the transmission gate 150 is activated.

In operation 430, a signal generated by a pre-driver of internal circuitry is transmitted to a post-driver through the transmission gate. In some embodiments, the output signal (e.g., voltage signal V1 at node N1) generated by the pre-driver 120 of the internal circuitry 104 can be transmitted to the gate terminal of transistor Q5 of the post-driver 130 through the transmission gate 150 since transistors Q1 and Q2 within the transmission gate 150 are turned on by the control signals H0 and L0, respectively. The transmission gate 150 being turned on can be regarded as a low-resistance path.

In operation 440, the first control signal in the second logic state and the second control signal in the first logic state are generated to deactivate the transmission gate to isolate the pre-driver from the post-driver. In some embodiments, the logic states of the first control signal (e.g., H0) and the second control signal (e.g., L0) during the normal operation mode are inverted by the detection circuit 160 in response to detecting an ESD event or stress occurring at the I/O pad 140. For example, the first control signal and the second control signal are respectively inverted to the low logic state (e.g., "0") and the high logic state (e.g., "1") by the detection circuit 160 in response to detecting an ESD event or stress occurring on the I/O pad 140, turning off transistors Q1 and Q2 within the transmission gate 150. Accordingly, the pre-driver 120 can be isolated from the post-driver 130 by the deactivated transmission gate 150.

In operation 450, suppressing a voltage difference across a victim transistor of the post-driver in response to an ESD event occurring on an I/O pad of the integrated circuit. In some embodiments, the victim transistor may be transistor Q5 of the post-driver 130, and the voltage difference may refer to the gate-to-drain voltage of transistor Q5. Since the transmission gate 150 is turned off, the gate terminal of transistor Q5 enters a floating state, and the gate voltage of transistor Q5 is substantially equal to an ESD voltage of the ESD event or stress occurring on the I/O pad 140 due to voltage coupling effect caused by the parasitic capacitance Cpar between the gate terminal and drain terminal of transistor Q5.

An aspect of the present disclosure provides an integrated circuit, which includes internal circuitry; a pre-driver, a switch device, a post-driver, and an I/O pad. The internal circuitry is configured to generate an input/output (I/O) signal. The pre-driver is configured to generate a first voltage signal based on the I/O signal. The switch device is coupled to the pre-driver. The post-driver is configured to convert the first voltage signal to a second voltage signal. The I/O pad is coupled to the post-driver, and configured to receive the second voltage signal. The switch device is activatable to electrically connect the internal circuitry to the post-driver when the integrated circuit is in a normal operation mode. The switch device is deactivatable to isolate the pre-driver from the post-driver when the integrated circuit is in an electrostatic discharge (ESD) mode and an ESD event occurs on the I/O pad.

Another aspect of the present disclosure provides an integrated circuit, which includes internal circuitry; a pre-driver, a switch device, a post-driver, and an I/O pad. The pre-driver is coupled between a first voltage supply node, a reference voltage supply node, and the internal circuitry. The switch device is coupled to the pre-driver. The post-driver is coupled between a second voltage supply node and the reference voltage supply node, and coupled to the pre-driver through the switch device. The I/O pad is coupled to the post-driver. The detection circuit is coupled between the second voltage supply node and the reference voltage supply node, and configured to generate a first control signal and a second control signal. The first control signal and the second control signal are in a first logic state and a second logic state, respectively, to activate the switch device when the integrated circuit is in a normal operation mode. The first control signal and the second control signal are in the second logic state and the first logic state, respectively, to deactivate the switch device when the integrated circuit is in an electrostatic discharge (ESD) mode and an ESD event occurs on the I/O pad.

Yet another aspect of the present disclosure provides a method, which includes the following steps: determining an operation mode of an integrated circuit; in response to the integrated circuit in an electrostatic discharge (ESD) mode, generating a first control signal in a first logic state and a second control signal in a second logic state to isolate a first terminal of a transmission gate from a second terminal of the transmission gate, wherein the first terminal and the second terminal are coupled to a pre-driver and a post-driver of the integrated circuit, respectively; and suppressing a voltage difference across a victim transistor of the post-driver in response to an ESD event occurring on an input/output pad of the integrated circuit.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. An integrated circuit, comprising:

internal circuitry, configured to generate an input/output (I/O) signal;

a pre-driver, coupled to the internal circuitry, configured to generate a first voltage signal based on the I/O signal;

a switch device, coupled to the pre-driver;

a post-driver, configured to convert the first voltage signal to a second voltage signal;

an I/O pad, coupled to the post-driver, and configured to receive the second voltage signal; and a detection circuit, configured to generate a first control signal in a first logic state and a second control signal in a second logic state when the integrated circuit is in a normal operation mode, and generate the first control signal in the second logic state and the second control signal in the first logic state when the integrated circuit is in an electrostatic discharge (ESD) mode and an ESD event occurs on the I/O pad, wherein the switch device is activatable to electrically connect the pre-driver to the post-driver when the integrated circuit is in the normal operation mode, wherein the switch device is deactivated to isolate the pre-driver from the post-driver when the integrated circuit is in the ESD mode and the ESD event occurs on the I/O pad.

2. The integrated circuit of claim 1, wherein:

the first voltage signal is within a first voltage domain between a first power supply voltage and a reference voltage;

the second voltage signal is within a second voltage domain between a second power supply voltage and the reference voltage; and the second power supply voltage is higher than the first power supply voltage.

3. The integrated circuit of claim 1, wherein the switch device comprises:

a first switch, coupled between a first node and a second node, and configured to receive the first control signal; and a second switch, coupled between the first node and the second node, and configured to receive the second control signal.

4. The integrated circuit of claim 3, wherein when the integrated circuit is in the normal operation mode, the first control signal and the second control signal are in the first logic state and the second logic state to turn on the first switch and the second switch, respectively.

5. The integrated circuit of claim 4, wherein when the integrated circuit is in the ESD mode and the ESD event occurs on the I/O pad, the first control signal and the second control signal are in the second logic state and the first logic state to turn off the first switch and the second switch, respectively.

6. The integrated circuit of claim 5, wherein the post-driver comprises:

a voltage pull-up section, coupled between a first voltage supply node and the I/O pad; and a voltage pull-down section, coupled between the I/O pad and a reference voltage supply node.

7. The integrated circuit of claim 6, further comprising:

a first diode, coupled between the first voltage supply node and the I/O pad; and a second diode, coupled between the I/O pad and the reference voltage supply node.

8. The integrated circuit of claim 6, wherein:

the first node is coupled to the pre-driver;

the second node is coupled to a gate terminal of a victim transistor within the voltage pull-up section of the post-driver; and a first terminal of the victim transistor is coupled to the I/O pad and the voltage pull-down section.

9. The integrated circuit of claim 8, wherein the gate terminal of the victim transistor is floating when the switch device is deactivated.

10. The integrated circuit of claim 6, further comprising:

an ESD power clamp, coupled between the first voltage supply node and the reference voltage supply node.

11. The integrated circuit of claim 10, wherein the detection circuit comprises:

a first transistor, having a gate terminal coupled to a third node, a first terminal coupled to the first voltage supply node, and a second terminal coupled to a fourth node;

a first capacitor, coupled between the first voltage supply node and the third node;

a second transistor, having a gate terminal coupled to the fourth node, a first terminal coupled to the third node, and a second terminal coupled to the reference voltage supply node; and a second capacitor, coupled between the fourth node and the reference voltage supply node.

12. The integrated circuit of claim 11, wherein the first control signal and the second control signal are generated at the third node and the fourth node, respectively.

13. The integrated circuit of claim 11, wherein the detection circuit further comprises: a first inverter chain, coupled to the third node, and comprising a first number of inverters connected in series; and a second inverter chain, coupled to the fourth node, and comprising the first number of inverters connected in series.

14. The integrated circuit of claim 13, wherein the first control signal and the second control signal are generated at a first point within the first inverter chain and a second point within the second inverter chain, respectively, and the first point and the second point have an equal number of inverters.

15. An integrated circuit, comprising:

internal circuitry;

a pre-driver, coupled between a first voltage supply node, a reference voltage supply node, and the internal circuitry;

a switch device, coupled to the pre-driver;

a post-driver, coupled between a second voltage supply node and the reference voltage supply node, and coupled to the pre-driver through the switch device;

an input/output (I/O) pad, coupled to the post-driver; and a detection circuit, coupled between the second voltage supply node and the reference voltage supply node, and configured to generate a first control signal and a second control signal, wherein the first control signal and the second control signal are in a first logic state and a second logic state, respectively, to activate the switch device when the integrated circuit is in a normal operation mode, wherein the first control signal and the second control signal are in the second logic state and the first logic state, respectively, to deactivate the switch device when the integrated circuit is in an electrostatic discharge (ESD) mode and an ESD event occurs on the I/O pad, wherein the detection circuit comprises:

a first transistor, having a gate terminal coupled to a first node, a first terminal coupled to the second voltage supply node, and a second terminal coupled to a second node;

a first capacitor, coupled between the second voltage supply node and the first node;

a second transistor, having a gate terminal coupled to the second node, a first terminal coupled to the first node, and a second terminal coupled to the reference voltage supply node; and a second capacitor, coupled between the second node and the reference voltage supply node.

16. The integrated circuit of claim 15, wherein the first control signal and the second control signal are generated at the first node and the second node, respectively.

17. The integrated circuit of claim 15, wherein the detection circuit further comprises:

a first inverter chain, coupled to the first node, and comprising a first number of inverters connected in series; and a second inverter chain, coupled to the second node, and comprising the first number of inverters connected in series, wherein the first control signal and the second control signal are generated at a first point within the first inverter chain and a second point within the second inverter chain, respectively, and the first point and the second point have an equal number of inverters.

18. A method, comprising:

determining an operation mode of an integrated circuit;

in response to the integrated circuit in an electrostatic discharge (ESD) mode, generating, by a detection circuit of the integrated circuit, a first control signal in a first logic state and a second control signal in a second logic state to isolate a first terminal of a transmission gate from a second terminal of the transmission gate, wherein the first terminal and the second terminal are coupled to a pre-driver and a post-driver of the integrated circuit, respectively; and suppressing a voltage difference across a victim transistor of the post-driver in response to an ESD event occurring on an input/output pad of the integrated circuit, wherein the detection circuit comprises:

a first transistor, having a gate terminal coupled to a first node, a first terminal coupled to a first voltage supply node, and a second terminal coupled to a second node;

a first capacitor, coupled between the first voltage supply node and the first node;

a second transistor, having a gate terminal coupled to the second node, a first terminal coupled to the first node, and a second terminal coupled to a reference voltage supply node; and a second capacitor, coupled between the second node and the reference voltage supply node.

19. The method of claim 18, further comprising:

in response to the integrated circuit in a normal operation mode, generating the first control signal in the second logic state and the second control signal in the first logic state to activate the transmission gate; and transmitting a signal generated by the pre-driver of an internal circuit of the integrated circuit to the post-driver through the transmission gate.

20. The method of claim 18, wherein the first control signal and the second control signal are generated at the first node and the second node, respectively.

* * * * *